(12) United States Patent
Wilkins

(10) Patent No.: US 6,282,138 B1
(45) Date of Patent: Aug. 28, 2001

(54) LATCHED SENSE AMPLIFIER WITH TRI-STATE OUTPUTS

(75) Inventor: James W. Wilkins, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/513,762

(22) Filed: Feb. 25, 2000

(Under 37 CFR 1.47)

Related U.S. Application Data

(60) Provisional application No. 60/121,575, filed on Feb. 25, 1999.

(51) Int. Cl.$^7$ .................................................. G11C 7/00
(52) U.S. Cl. ........................... 365/207; 365/203; 327/52; 327/57
(58) Field of Search ..................................... 365/207, 203, 365/204, 190, 154; 327/52, 55, 57

(56) References Cited

U.S. PATENT DOCUMENTS

| | | | |
|---|---|---|---|
| 3,980,898 | | 9/1976 | Priel .......................................... 326/56 |
| 4,811,295 | * | 3/1989 | Shinoda ................................. 365/219 |
| 5,228,106 | * | 7/1993 | Ang et al. ............................. 365/203 |
| 5,280,205 | | 1/1994 | Green et al. ........................... 327/51 |
| 5,289,420 | * | 2/1994 | Neu ........................................ 365/207 |
| 5,485,430 | * | 1/1996 | McClure ............................... 365/196 |
| 5,486,780 | | 1/1996 | Lu ......................................... 327/53 |
| 5,493,533 | | 2/1996 | Lambrache ........................... 365/210 |
| 5,506,522 | * | 4/1996 | Lee ........................................ 327/55 |
| 5,608,681 | * | 3/1997 | Priebe et al. .......................... 365/207 |
| 5,856,949 | * | 1/1999 | Jiang .................................... 365/203 |
| 6,108,254 | * | 8/2000 | Watanabe et al. .................... 365/203 |

OTHER PUBLICATIONS

Seki et al., A 6-ns 1-Mb CMOS SRAM with Latched Sense Amplifier, IEEE Journal of Solid-State Circuits, vol. 28, No. 4, Apr. 1993, pp. 478–483.

* cited by examiner

Primary Examiner—Tan T. Nguyen
(74) Attorney, Agent, or Firm—TraskBritt

(57) ABSTRACT

An inventive sense amplifier in a memory device includes a feedback-controlled differential amplifier with a pair of differential output terminals, one of which is driven to ground and the other of which is driven to the supply voltage $V_{CC}$ when a logic "1" or "0" bit is sensed by the sense amplifier. Pre-charge circuitry pre-charges the output terminals of the differential amplifier to the supply voltage $V_{CC}$ before a logic bit is sensed so little or no time is wasted pulling one of the terminals up to the supply voltage $V_{CC}$ when a logic bit is sensed. Tri-state output circuitry connected to the differential amplifier outputs a sensed logic bit to an internal data bus of the memory device, and the tri-state nature of the output circuitry allows the circuitry to present a high impedance to the internal data bus. As a result, the sense amplifier can share the internal data bus with other sense amplifiers without interfering with the operation of the other sense amplifiers.

18 Claims, 4 Drawing Sheets

LATCHED SENSE AMPLIFIER WITH TRI-STATE OUTPUTS

CROSS REFERENCE TO RELATED APPLICATION

This application claims the benefit of U.S. Provisional Application No. 60/121,575, filed Feb. 25, 1999.

BACKGROUND OF THE INVENTION

1. Field of the Invention

This invention relates in general to semiconductor memory devices and, more specifically, to latched sense amplifiers in such memory devices having pre-charge circuitry and tri-state outputs.

2. State of the Art

As shown in FIG. 1, in general, a conventional sense amplifier 10 known from Seki, et al., "A 6-ns 1-Mb CMOS SRAM with Latched Sense Amplifier," IEEE Journal of Solid-State Circuits, Vol. 28, No. 4, pp. 478–483 (1993), receives logic bits output from memory cells (not shown) on complementary bitline bus conductors LD1 and LD2, amplifies the received logic bits at latch output nodes NODE 1 and NODE 2, and outputs the amplified logic bits onto internal data bus conductors (not shown). Output buffers (not shown) connected to the internal data bus conductors then output the logic bits for use by external circuitry (not shown), such as a microprocessor.

More specifically, the sense amplifier 10 begins an operation cycle when an equalization signal SP goes high and turns on equalization NMOS transistors 12 and 14, thereby equalizing electric charge stored on latch output nodes NODE 1 and NODE 2 and on internal nodes NODE 3 and NODE 4. Shortly thereafter, a sense amplifier enabling signal SAC goes high and turns on a current source NMOS transistor 16, thus enabling latching circuitry 18 of the sense amplifier 10. At the same time, the equalized stored charge on latch output nodes NODE 1 and NODE 2 induces a voltage on these nodes of approximately half the supply voltage $V_{CC}$ (i.e., $V_{CC}/2$), which is of sufficient magnitude to moderately turn on sourcing NMOS transistors 20 and 22.

With the latching circuitry 18 enabled, the equalization signal SP goes low to turn off the equalization NMOS transistors 12 and 14. In this state of the sense amplifier 10, the latch output nodes NODE 1 and NODE 2 are isolated from one another, allowing the sense amplifier 10 to latch in a logic bit from the bitline bus conductors LD1 and LD2 when it appears.

A logic bit from a memory cell (not shown) appears in a complementary fashion on the bitline bus conductors LD1 and LD2, with one of the conductors LD1 and LD2 having a voltage of approximately half the supply voltage $V_{CC}$ (i.e., $V_{CC}/2$), and the other having the same voltage less about 200 millivolts (mV) (i.e., ($V_{CC}/2$)–200 mV). Thus, a logic "1" bit appears as an approximately 200 mV difference in voltages on the bitline bus conductors LD1 and LD2, with the bitline bus conductor LD1 having the higher voltage. Similarly, a logic "0" bit also appears as an approximately 200 mV difference in voltages on the bitline bus conductors LD1 and LD2, but with the bitline bus conductor LD2 having the higher voltage.

When a logic "1" bit, for example, appears on the bitline bus conductors LD1 and LD2 for latching into the sense amplifier 10, the voltages on the bitline bus conductors LD1 and LD2 representing the logic "1" bit turn on driving transistors 24 and 26, with the higher voltage on the bitline bus conductor LD1 turning on the driving transistor 24 more than the lower voltage on the bitline bus conductor LD2 turns on the driving transistor 26. Because the driving transistor 24 is on more than the driving transistor 26, the charge stored on the latch output node NODE 1 drains to ground through the transistors 24, 20, and 16 more rapidly than the charge stored on the latch output node NODE 2 can drain to ground through the transistors 26, 22, and 16. As a result, the voltage on the latch output node NODE 1 drops more rapidly than the voltage on the latch output node NODE 2.

This more-rapidly-dropping voltage on the latch output node NODE 1 causes a PMOS load transistor 28 and a sourcing PMOS transistor 30 to turn on, thereby pulling the latch output node NODE 2 substantially to the supply voltage $V_{CC}$. The supply voltage $V_{CC}$ on the latch output node NODE 2 then turns the sourcing NMOS transistor 20 fully on, and causes a PMOS load transistor 32 and a sourcing PMOS transistor 34 to be off, thereby causing the transistors 24, 20, and 16 to rapidly drain any remaining charge on the latch output node NODE 1 to ground so that the voltage on the latch output node NODE 1 is substantially at ground. In turn, the ground voltage on the latch output node NODE 1 turns the PMOS load transistor 28 and sourcing PMOS transistor 30 fully on, thereby reinforcing the supply voltage $V_{CC}$ on the latch output node NODE 2. In this state of the latching circuitry 18, the logic "1" bit is latched in. Of course, if the logic bit is a logic "0" bit, the latching circuitry 18 latches in the logic bit in the opposite manner.

The Seki, et al. sense amplifier 10 of FIG. 1 generally latches in a logic bit more rapidly than many sense amplifiers that preceded it. Still, it is desirable to have a sense amplifier that latches in logic bits even more rapidly to further improve the speed with which the logic bits may be read from semiconductor memory devices.

SUMMARY OF THE INVENTION

The present invention recognizes that the conventional Seki, et al. sense amplifier described above does not latch in logic bits as rapidly as it could. This is because the Seki, et al. sense amplifier latches in a logic bit, in part, by pulling one of its latch output nodes up to a supply voltage $V_{CC}$ from a voltage approximately intermediate the supply voltage $V_{CC}$ and ground. The time it takes for the Seki, et al. sense amplifier to pull one of its latch output nodes up to the supply voltage $V_{CC}$ is excess sensing time that is substantially eliminated by the present invention.

A sense amplifier in accordance with the present invention includes a differential amplifier having a pair of differential input terminals that receives bitline bus signal and its complement (i.e., receives logic "1" or "0" bit in a complementary manner) and a pair of differential outputs terminals that output the bitline bus signal and its complement in a differentiated manner. Pre-charge circuitry selectively pre-charges the input and output terminals of the differential amplifier to, for example, the supply voltage $V_{CC}$, and a pair of complementary output terminals of a tri-state output circuit coupled to the differential amplifier outputs an internal data bus signal and its complement in response to the differentiated bitline bus signal and its differentiated complement. So the sense amplifier can share the internal data bus with other sense amplifiers, the complementary output terminals of the tri-state output circuit are capable of attaining a high-impedance state when the sense amplifier is inactive.

Because the inventive sense amplifier pre-charges the output terminals of its differential amplifier to, for example, the supply voltage $V_{CC}$, no time is wasted pulling one of those terminals up during sensing, in contrast to the Seki, et al. sense amplifier previously described. Thus, the present invention provides a sense amplifier that rapidly latches in logic bits in order to improve the speed with which the logic bits may be read from semiconductor memory devices.

In other embodiments of the present invention, the sense amplifier described above is incorporated into a memory device, such as a Static Random Access Memory (SRAM), an electronic system, and a semiconductor wafer.

In still another embodiment, a method for increasing the sensing speed of a sense amplifier that has a differential amplifier with outputs that achieve a high or a low voltage during sensing of a logic bit includes pre-charging the outputs substantially to the high voltage prior to sensing the logic bit. As a result, the logic bit may be sensed more rapidly.

In yet another embodiment, a bitline bus signal and its complement are sensed by providing first and second complementary nodes at which a difference in voltage between the bitline bus signal and its complement may be amplified so one of the nodes is at a high voltage and the other is at a low voltage. The nodes are pre-charged substantially to the high voltage, and the difference in voltage between the bitline bus signal and its complement is then amplified so one of the nodes is at the high voltage and the other is at the low voltage. The high and low voltages on the nodes are then output as complementary data bus signals.

DETAILED DESCRIPTION OF THE ILLUSTRATED EMBODIMENTS

Figure 1:
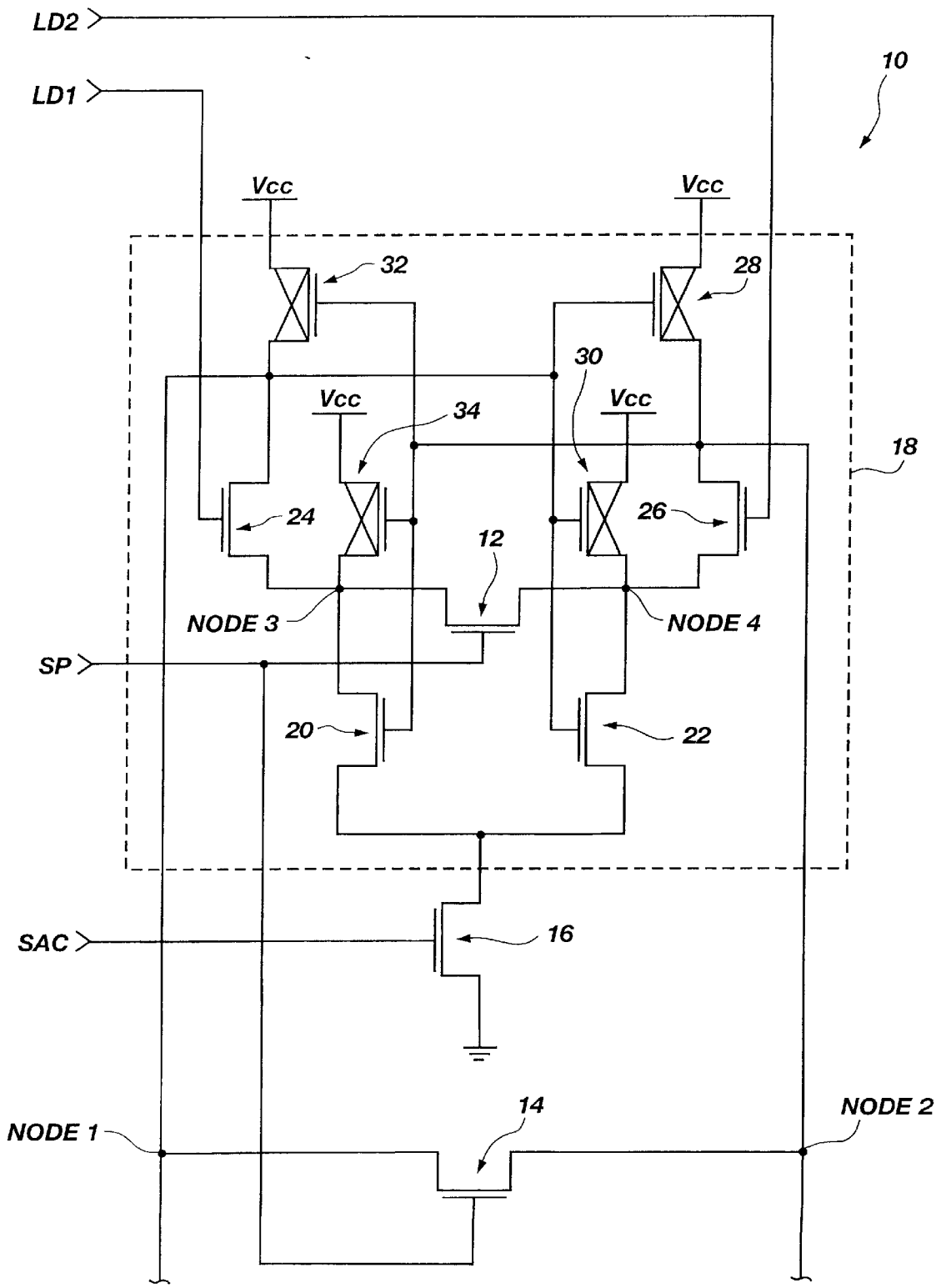
FIG. 1 is a circuit schematic of a conventional sense amplifier for semiconductor memory devices.
Figure 2:
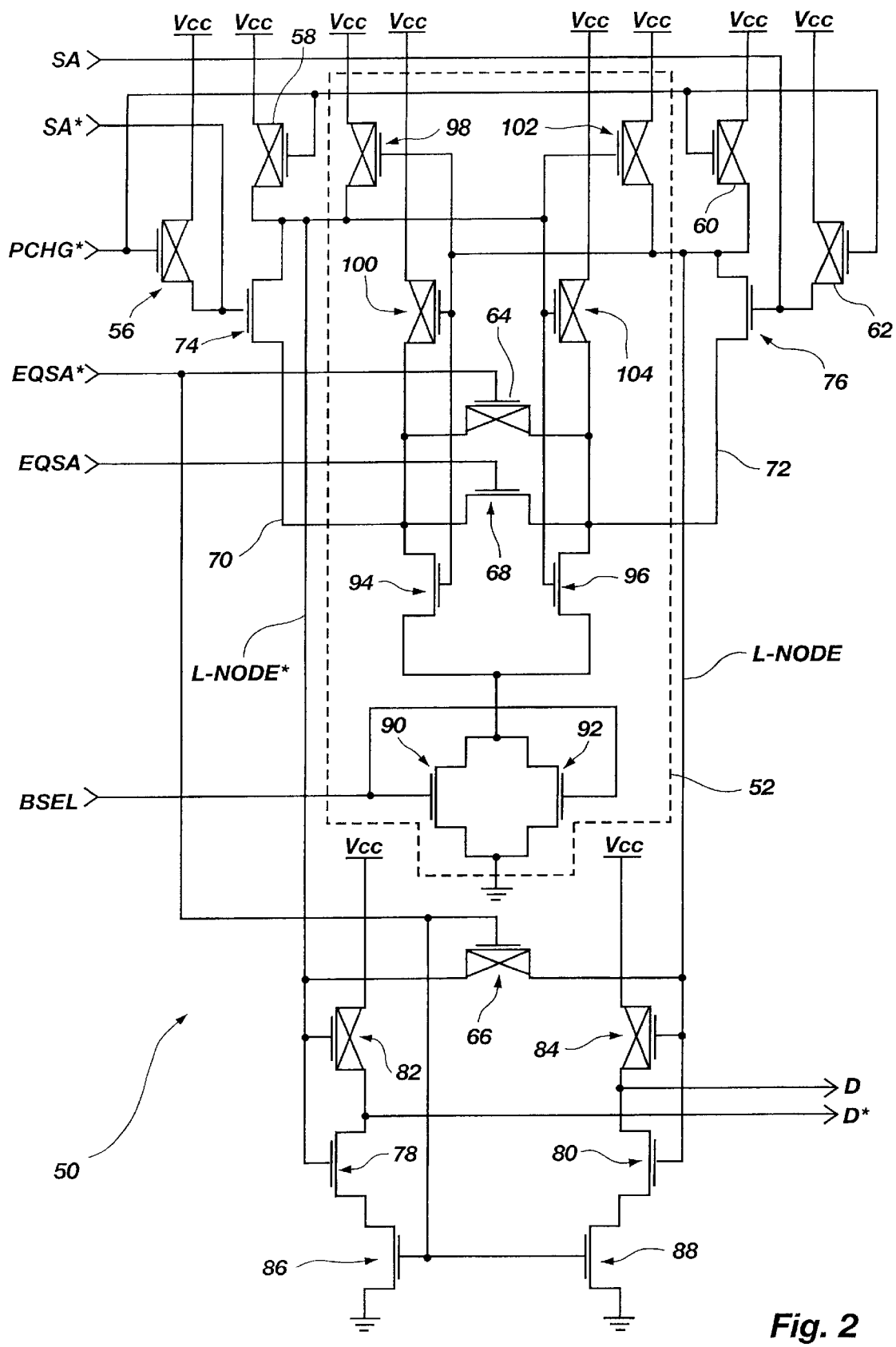
FIG. 2 is a circuit schematic of a sense amplifier in accordance with the present invention.

As shown in FIG. 2, in general, a sense amplifier 50 in accordance with the present invention receives logic bits output from memory cells (not shown) in a Static Random Access Memory (SRAM) (see FIG. 3) on complementary bitline bus conductors SA and SA*, amplifies the received logic bits at latch output nodes L-NODE and L-NODE* of a feedback-controlled differential amplifier 52, and outputs the amplified logic bits at complementary output terminals D and D*. An internal data bus (see FIG. 3) connected to the terminals D and D* carries the logic bits to output buffers (see FIG. 3) of the SRAM, where the logic bits are output for use by circuitry external to the SRAM, such as a processor device (see FIG. 4). It will be understood by those having skill in the field of this invention that although the invention will be described in relation to an SRAM, it is equally applicable to any other memory device, including a Dynamic RAM (DRAM).

More specifically, the sense amplifier 50 begins an operation cycle with a pre-charge signal PCHG* in a low state, which turns on pre-charge PMOS transistors 56, 58, 60, and 62, thereby charging the bitline bus conductors SA and SA* and the latch output nodes L-NODE and L-NODE* substantially to the supply voltage $V_{CC}$. At the same time, equalization signals EQSA and EQSA* are respectively high and low so equalization PMOS transistors 64 and 66 and an equalization NMOS transistor 68 are all on, thereby equalizing voltages on the latch output nodes L-NODE and L-NODE* and on the internal nodes 70 and 72. With the bitline bus conductors SA and SA* charged to the supply voltage $V_{CC}$, driving NMOS transistors 74 and 76 turn on, allowing the voltages on the latch output nodes L-NODE and L-NODE* and the internal nodes 70 and 72 to equalize. Of course, while the sense amplifier 50 of the present invention is described as being pre-charged by PMOS transistors, it will be understood that any device or devices capable of pre-charging a sense amplifier will work for purposes of the present invention.

The pre-charged latch output nodes L-NODE and L-NODE* turn on output NMOS transistors 78 and 80 and turn off output PMOS transistors 82 and 84, while the low equalization signal EQSA* turns off tri-state NMOS transistors 86 and 88. As a result, the output terminals D and D* are in a state of high output impedance.

This ability of the sense amplifier 50 to present a high output impedance at the output terminals D and D* is advantageous because it allows the sense amplifier 50 to share the internal data bus (see FIG. 3) globally with other sense amplifiers (see FIG. 3) without interfering with the other sense amplifiers' use of the bus. Of course, it will be known by those of skill in the field of this invention that the circuitry comprising the transistors 78, 80, 82, 84, 86, and 88 is generally referred to as "tri-state output circuitry," and that a wide variety of tri-state output circuitry different than that shown in FIG. 2 will also work for purposes of the present invention.

In anticipation of the sense amplifier 50 receiving a logic bit on the bitline bus conductors SA and SA*, the pre-charge signal PCHG* goes high, turning off pre-charge PMOS transistors 56, 58, 60, and 62. A block select signal BSEL then goes high, turning on current source NMOS transistors 90 and 92. If sourcing NMOS transistors 94 and 96 have not already been turned on by the pre-charged latch output nodes L-NODE and L-NODE*, turning on the current source NMOS transistors 90 and 92 pulls the sources of the transistors 94 and 96 low enough for these transistors 94 and 96 to turn on. Shortly thereafter, the equalization signals EQSA and EQSA* respectively go low and high, turning off equalization transistors 64, 66, and 68, and turning on tri-state NMOS transistors 86 and 88, which causes voltages on the output terminals D and D* to begin to "drop." In this state, the latch output nodes L-NODE and L-NODE* and the internal nodes 70 and 72 are isolated from one another, so the sense amplifier 50 is ready to receive a logic bit.

A logic bit from a memory cell (not shown) appears in a complementary fashion on the bitline bus conductors SA and SA*, with one of the conductors SA and SA* having a voltage of approximately half the supply voltage $V_{CC}$ (i.e., $V_{CC}/2$), and the other having the same voltage less about 200 millivolts (mV) (i.e., $(V_{CC}/2)-200$ mV). Thus, a logic "1" bit appears as an approximately 200 mV difference in voltages on the bitline bus conductors SA and SA*, with the bitline bus conductor SA having the higher voltage. Similarly, a logic "0" bit also appears as an approximately 200 mV difference in voltages on the bitline bus conductors SA and SA*, but with the bitline bus conductor SA* having the higher voltage.

When a logic "1" bit, for example, appears on the bitline bus conductors SA and SA* for latching into the sense amplifier 50, the voltages on the bitline bus conductors SA and SA* representing the logic "1" bit keep both of the driving transistors 74 and 76 on, but the higher voltage on the bitline bus conductor SA keeps the driving transistor 76 on more than the lower voltage on the bitline bus conductor SA* keeps the driving transistor 74 on. Because the driving transistor 76 is on more than the driving transistor 74, the charge stored on the latch output node L-NODE drains to ground through the transistors 76, 96, 92, and 90 more rapidly than the charge stored on the latch output node L-NODE* can drain to ground through the transistors 74, 94, 90, and 92. As a result, the voltage on the latch output node L-NODE drops more rapidly than the voltage on the latch output node L-NODE*.

This more-rapidly-dropping voltage on the latch output node L-NODE causes a PMOS load transistor 98 and a sourcing PMOS transistor 100 to turn on, thereby pulling the latch output node L-NODE* back to the supply voltage $V_{CC}$ that it was previously pre-charged to. The supply voltage $V_{CC}$ on the latch output node L-NODE* then turns the sourcing NMOS transistor 96 fully on, and causes a PMOS load transistor 102 and a sourcing PMOS transistor 104 to be off, thereby causing the transistors 76, 96, 92, and 90 to rapidly drain any remaining charge on the latch output node L-NODE to ground so that the voltage on the latch output node L-NODE is substantially at ground. In turn, the ground voltage on the latch output node L-NODE turns the PMOS load transistor 98 and sourcing PMOS transistor 100 fully on, thereby reinforcing the supply voltage $V_{CC}$ on the latch output node L-NODE*. In this state of the sense amplifier 50, the logic "1" bit is latched in.

The low voltage on the latch output node L-NODE turns on the output PMOS transistor 84 and turns off the output NMOS transistor 80, thereby pulling the output terminal D high. At the same time, with the tri-state NMOS transistor 86 on, the high voltage on the latch output node L-NODE* turns on the output NMOS transistor 78 and turns off the output PMOS transistor 82, thereby pulling the output terminal D* low.

Figure 3:
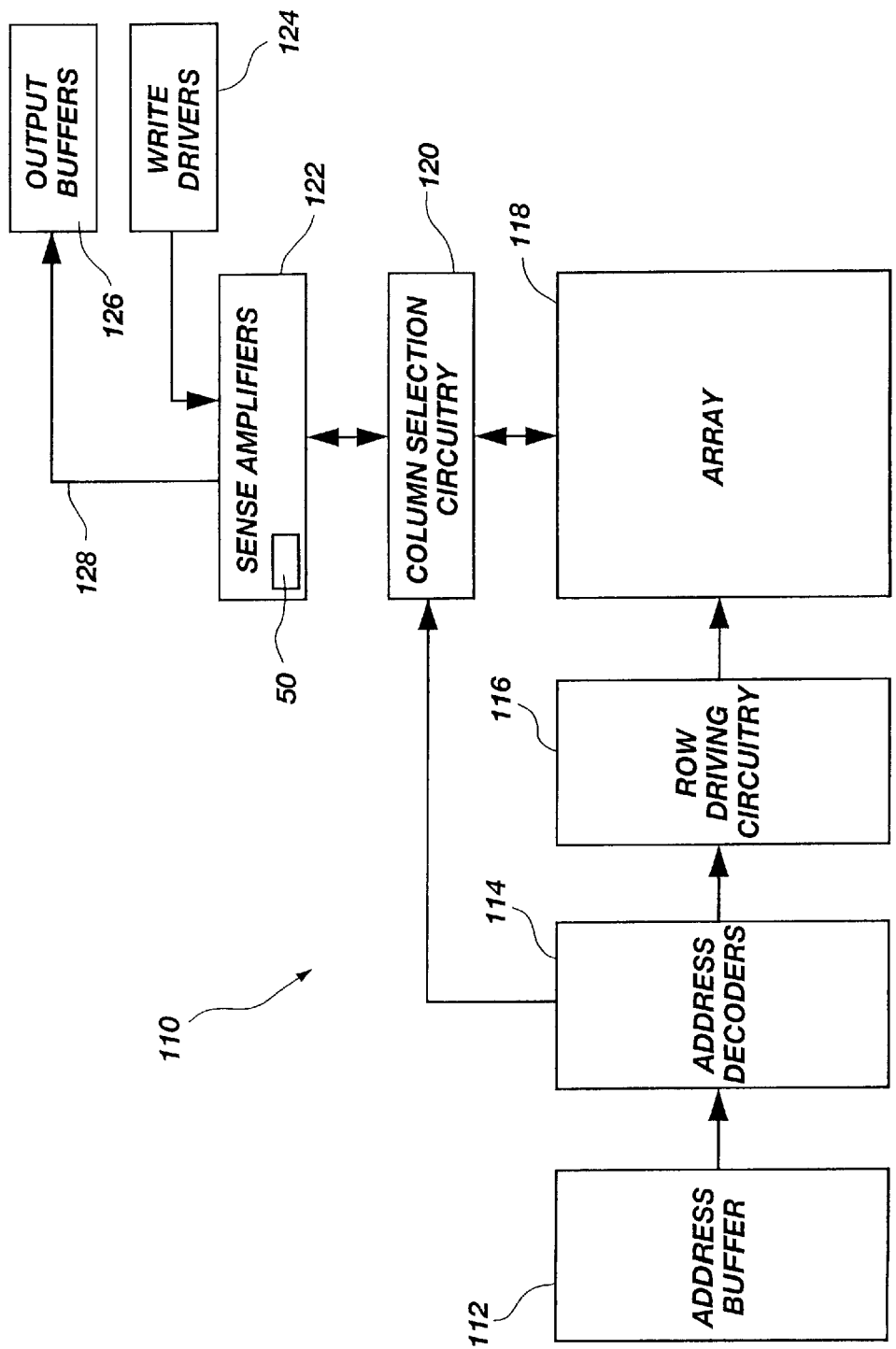
FIG. 3 is a block diagram of a Static Random Access Memory (SRAM) incorporating the sense amplifier of FIG. 2.

In this manner, the sense amplifier 50 outputs the logic "1" bit onto the internal data bus (see FIG. 3). Of course, it will be understood that the sense amplifier 50 may also receive a logic "0" bit on the bitline bus conductors SA and SA* and output that bit onto the internal data bus by operating in a manner complementary to that described above.

It should be noted that, in contrast to the conventional Seki, et al. sense amplifier described previously, the sense amplifier of the present invention speeds up the latching-in of logic bits by pre-charging its latch output nodes L-NODE and L-NODE* to the supply voltage $V_{CC}$ so that little time is necessary to pull either node high when a logic bit is latched in.

As shown in FIG. 3, an SRAM 110 includes an address buffer 112, address decoders 114, row driving circuitry 116, a memory array 118, column selection circuitry 120, sense amplifiers 122 which include the sense amplifier 50 of FIG. 2, write drivers 124, and output buffers 126 connected to the sense amplifiers 122 by an internal data bus 128.

Figure 4:
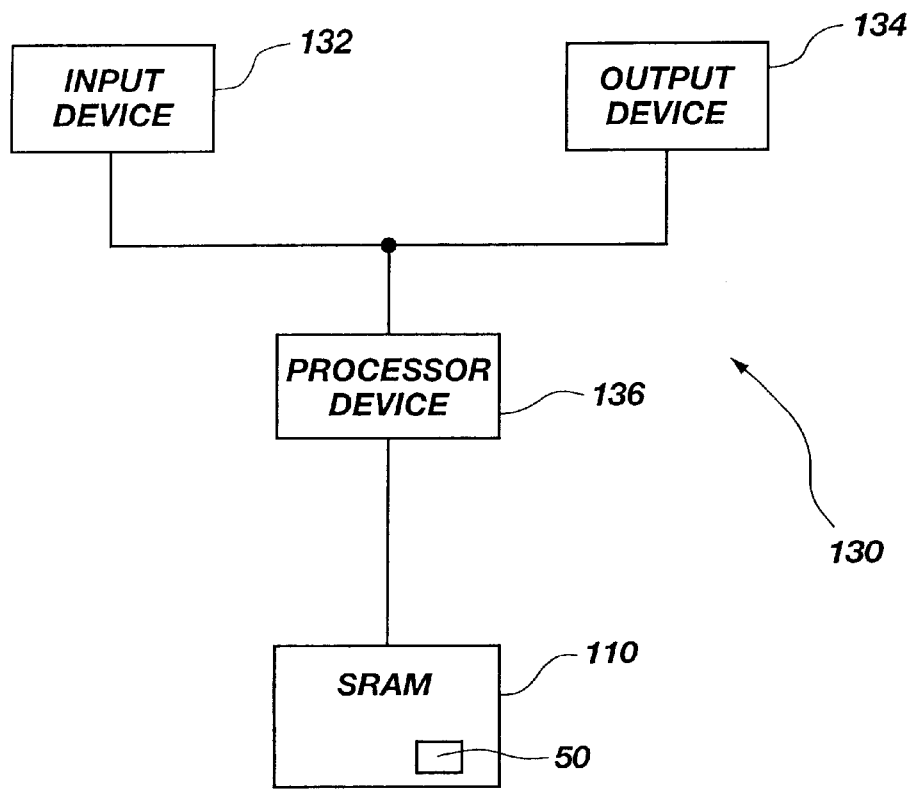
FIG. 4 is a block diagram of an electronic system including the SRAM of FIG. 3.
Figure 5:
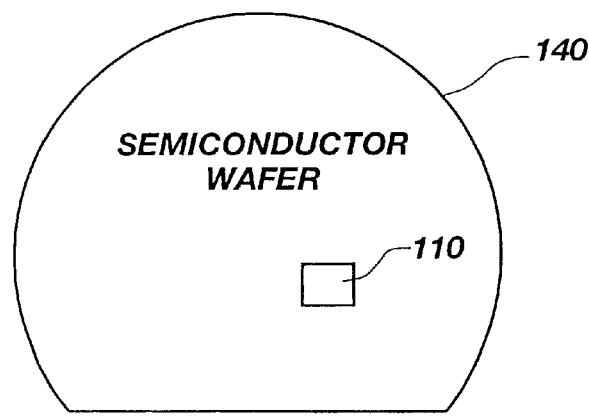
FIG. 5 is a diagram of a semiconductor wafer on which is fabricated the SRAM of FIG. 3.

As shown in FIG. 4, an electronic system 130 includes an input device 132, an output device 134, a processor device 136, and a memory device, such as the SRAM 110 of FIG. 3, which incorporates the sense amplifier 50 of FIG. 2. Of course, any one of the input, output, and processor devices 132, 134, and 136 could also include a memory device that incorporates the sense amplifier 50 of FIG. 2. As shown in FIG. 5, the SRAM 110 of FIG. 3 is fabricated on the surface of a semiconductor wafer 140.

Although the present invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A sense amplifier comprising:

a differential amplifier having a pair of differential input terminals for receiving a bitline bus signal and its complement and a pair of differential output terminals for outputting the bitline bus signal and its complement in a differentiated manner;

pre-charge circuitry coupled to the pairs of differential input and output terminals of the differential amplifiers for selectively pre-charging the pairs of differential input and output terminals in response to a pre-charge signal; and tri-state output circuitry having a pair of input terminals coupled to the pair of differential output terminals of the differential amplifier for receiving the differentiated bitline bus signal and its differentiated complement and having a pair of complementary output terminals for outputting an internal data bus signal and its complement in response to the differentiated bitline bus signal and its differentiated complement, the pair of complementary output terminals being capable of attaining a high-impedance state in response to a tri-state initiating signal.

2. The sense amplifier of claim 1 wherein the differential amplifier, the pre-charge circuitry, and the tri-state output circuitry each comprise a plurality of NMOS and PMOS transistors.

3. The sense amplifier of claim 1 wherein the differential amplifier has a pair of differential input terminals for receiving said bitline bus signal at a voltage intermediate a supply voltage and ground and for receiving the complement of the bitline bus signal at a voltage less than the voltage of the bitline bus signal by about 200 mV and has a pair of differential output terminals for outputting the bitline bus signal and its complement in a differentiated manner with the bitline bus signal substantially at the supply voltage and the complement of the bitline bus signal substantially at ground.

4. The sense amplifier of claim 1 wherein the pair of differential output terminals of the differential amplifier comprises latch output nodes.

5. The sense amplifier of claim 1 wherein the pre-charge circuitry comprises pre-charge circuitry for selectively pre-charging the pair of differential output terminals of the differential amplifier to a supply voltage.

6. A memory device comprising:

an address buffer;

address decoders coupled to the address buffer;

row driving circuitry coupled to the address decoders;

a memory array coupled to the row driving circuitry;

column selection circuitry coupled to the address decoders and the memory array;

output buffers;

write drivers; and sense amplifiers coupled to the output buffers, the write drivers, and the memory array, each of the sense amplifiers comprising:

a differential amplifier having a pair of differential input terminals for receiving a bitline bus signal and its complement and a pair of differential output terminals for outputting the bitline bus signal and its complement in a differentiated manner;

pre-charge circuitry coupled to the pairs of differential input and output terminals of the differential amplifier for selectively pre-charging the pairs of differential input and output terminals in response to a pre-charge signal; and tri-state output circuitry having a pair of input terminals coupled to the pair of differential output terminals of the differential amplifier for receiving the differentiated bitline bus signal and its differentiated complement and having a pair of complementary output terminals for outputting an internal data bus signal and its complement in response to the differentiated bitline bus signal and its differentiated complement, the pair of complementary output terminals being capable of attaining a high-impedance state in response in response to a tri-state initiating signal.

7. The memory device of claim 6 wherein the memory array comprises an SRAM memory array.

8. An electronic system comprising an input device, an output device, a memory device, and a processor device coupled to the input, output, and memory devices, at least one of the input, output, memory, and processor devices including a sense amplifier comprising:

a differential amplifier having a pair of differential input terminals for receiving a bitline bus signal and its complekment and a pair of differential output terminals for outputting the bitline bus signal and its complement in a differentiated manner;

pre-charge circuitry coupled to the pairs of differential input and output terminals of the differential amplifier for selectively pre-charging the pairs of differential input and output terminals in response to a pre-charge signal; and tri-state output circuitry having a pair of input terminals coupled to the pair of differential output terminals of the differential amplifier for receiving the differentiated bitline bus signal and its differentiated complement and having a pair of complementary output terminals for outputting an internal data bus signal and its complement in response to the differentiated bitline bus signal and its differentiated complement, the pair of complementary output terminals being capable of attaining a high-impedance state in response to a tri-state initiating signal.

9. A semiconductor wafer including an SRAM having:

an address buffer;

address decoders coupled to the address buffer;

row driving circuitry coupled to the address decoders;

a SRAM memory array coupled to the row driving circuitry;

column selection circuitry coupled to the address decoders and the memory array;

output buffers;

write drivers; and sense amplifiers coupled to the output buffers, the write drivers, and the memory array, each of the sense amplifiers comprising;

a differential amplifier having a pair of differential input terminals for receiving a bitline bus signal and its complement and a pair of differential output terminals for outputting the bitline bus signal and its complement in a differentiated manner;

pre-charge circuitry coupled to the pairs of differential input and output terminals of the differential amplifier for selectively pre-charging the pairs of differential input and output terminals in reponse to a pre-charge signal; and tri-state output circuitry having a pair of input terminals coupled to the pair of differential output terminals of the differential amplifier for receiving the differentiated bitline bus signal and its differentiated complement and having a pair of complementary output terminals for outputting an internal data bus signal and its complement in response to the differentiated bitline bus signal and its differentiated complementm the pair of complementary output terminals being capable of attaining a high-imepedance state in response to a tri-state initiating signal.

10. A method for sensing a bitline bus signal and its complement, the method comprising:

providing first and second complementary nodes at which a difference in voltage between the bitline bus signal and its complement may be amplified so one of the first and second complementary nodes is at a high voltage and the other is a low voltage;

pre-charging the firs and second complementary nodes substantially to the high voltage in response to a first signal;

amplifying the difference in voltage between the bitline bus signal and its complement so one of the first and second complementary nodes it at the high voltage and the other is at the low voltage;

outputting the high and low voltages on the first and secondary complementary nodes as complementary data bus signals; and selectively outputting the complementary data bus signals in a high impedance state in response to a second signal.

11. The method of claim 10 wherein the selectively outputting the complementary data bus signals in a high impedance state in response to the second signal comprises outputting the complementary data bus signals from tri-state output circuitry in a high impedance state.

12. The method of claim 10 wherein the providing the first and second complementary nodes comprising providing a feedback-controlled differential amplifier having a pair of input terminals for receiving the bitline bus signal and its complement and a pair of output terminals at which the difference in voltage between the bitline bus signal and its complement can be amplified so one of the pair of output terminals is at the high voltage and the other is at the low voltage.

13. The method of claim 10 wherein the providing the first and second complementary nodes comprises providing nodes at which the difference in voltage between the bitline bus signal and its complements may be amplified so one of the nodes is at a supply voltage and the other is at ground.

14. The method of claim 10 wherein the pre-charging the first and second complementary nodes comprises selectively coupling the first and second complementary nodes to a supply voltage through at least one PMOS transistor.

15. The method of claim 10 wherein the amplifying the difference in voltage between the bitline bus signal and its complement comprises amplifying the difference so one of the first and second complementary nodes is substantially at a supply voltage and the other is substantially at ground.

16. The method of claim 10 wherein the amplifying the difference is voltage between the bitline bus signal and its complement comprises amplifying the difference using a differential amplifier.

17. The method of claim 10 wherein the outputting the high and low voltages on the first and second complementary data bus signals comprises outputting the high and low voltages on the first and second complementary nodes onto an internal data bus of an SRAM device using tri-state output circuitry.

18. The method of claim 10, further comprising generating the first signal as a pre-charge signal and generating the second signal as a tri-state initiating signal.

* * * * *